US005285165A

United States Patent [19]
Renfors et al.

[11] Patent Number: 5,285,165
[45] Date of Patent: Feb. 8, 1994

[54] NOISE ELIMINATION METHOD

[76] Inventors: Markku K. Renfors, Oraskatu 7, Tampre, Finland, SF-33800; Yrjö A. O. Neuvo, Parkanonkatu 3, Tampere, Finland, SF-33720; Jorma J. Mäkinen, Orivendenkatu 8E109, Tampere, Finland, SF-33720; Aarne H. K. Tenhunen, Lindforsinkatu 10B23, Tampere, Finland, SF-33720; Juha Rapeli, Kosteperänkatu 2B34, Oulu, Finland, SF-90100

[21] Appl. No.: 913,675

[22] Filed: Jul. 14, 1992

Related U.S. Application Data

[63] Continuation-in-part of Ser. No. 349,160, May 9, 1989, abandoned.

[30] Foreign Application Priority Data

May 26, 1989 [FI] Finland ................................ 882494

[51] Int. Cl.[5] ............................ H03B 1/00; H04B 1/10
[52] U.S. Cl. ................................ 328/167; 328/162; 328/163; 455/303; 455/235.1
[58] Field of Search ................ 328/162, 163, 165, 167, 328/14; 307/520, 521, 529; 455/296, 297, 303, 304, 305, 306, 308, 235.1; 375/102

[56] References Cited

U.S. PATENT DOCUMENTS

| | | | |
|---|---|---|---|
| 3,649,922 | 3/1972 | Ralph et al. | 328/165 |
| 3,699,461 | 10/1972 | Huntsinger | 328/167 |
| 3,731,188 | 5/1973 | Smith | 328/167 |
| 3,857,104 | 12/1974 | Sacks | 328/167 |
| 4,604,755 | 8/1986 | Murray | 455/235.1 |

Primary Examiner—William L. Sikes
Assistant Examiner—Toan Tran
Attorney, Agent, or Firm—Darby & Darby

[57] ABSTRACT

The present invention relates to a method for eliminating noise in a signal. The frequency band of the signal is divided into sub-bands, whereafter the useful value of the signal of each sub-band is determined by comparing the signal level to a reference level, in which case a constant signal of substantially the same level as the reference level is suppressed as noise and a varying signal, defined as a useful signal, is combined, unsuppressed, with the useful signals of the other sub-bands. The frequency band of the channel is divided into sub-bands by means of an all-pass filter construction. The method can be implemented using an analog or a digital filter construction.

10 Claims, 6 Drawing Sheets

NOISE ELIMINATION METHOD

This is a continuation-in-part of U.S. application Ser. No. 07/349,160, filed May 9, 1989 now abandoned.

FIELD OF THE INVENTION

The present invention relates to a noise elimination method, and more particularly, to a method for eliminating noise in a signal by separating the signal into frequency sub-bands, filtering the noisy sub-bands, and combining the filtered sub-bands.

BACKGROUND OF THE INVENTION

Communications signals, for example, mobile radio telephone signals, are often disturbed by noise. This noise may be caused by a variety of factors, such as a poor connection or ambient noise around the microphone. For example, ambient noise in an automobile may be picked up by the telephone and transmitted as background noise.

There are several methods known in the art for eliminating this noise. For example, a high-pass filter may be used to remove low frequency noise. However, when the mobile telephone receives a signal from cellular stations, the generated noise is sometimes within the same high frequency range as the speech signal. Thus, the noise is not eliminated by the high-pass filter and cannot be eliminated without removing the speech as well.

Efforts have been made to eliminate automobile background noise. One method places a second microphone (e.g., a second "telephone mouthpiece") at a location remote from the user so that this microphone picks up only ambient noise. This second microphone's signal is inverted and summed with the signal from the first microphone to cancel or eliminate background noise from the entire signal before transmitting the speech signal. However, this method results in only a slight improvement in the signal-to-noise ratio because it is often difficult to place the microphone in a suitable place where it will pick up the correct amount and type of noise without also picking up and cancelling part of the voice signal.

SUMMARY OF THE INVENTION

An object of the present invention is to eliminate unwanted noise from a radio telephone signal without the difficulties and drawbacks of the methods described above.

Another object is to provide a method by which it is possible to eliminate noise in a communication signal without suppressing the desired signal.

The method according to the present invention solves these problems by (1) dividing the noisy signal into frequency sub-bands; (2) separately determining the useful value of each sub-band's signal by comparing the signal level to a measured reference level; (3) determining if the signal is substantially similar to the reference level (indicating noise to be suppressed) or if the signal varies (indicating a useful signal to be passed unsuppressed); and (4) combining the substantially unsuppressed, useful signals of the sub-bands to form a noise attenuated output signal.

Because a speech signal does not use the entire frequency range all the time, entire frequency sub-bands are eliminated, and sub-bands containing both noise and useful signals are attenuated.

BRIEF DESCRIPTION OF THE DRAWINGS

The foregoing features of the present invention will be more readily apparent from the following detailed description and drawings of an illustrative embodiment of the invention in which.

DETAILED DESCRIPTION OF A PREFERRED EMBODIMENT

The method according to the present invention may be used in either a digital or analog circuit. Thus, the communication signal to be treated by the claimed method may be either an analog voltage or a corresponding digital value. Reference to "the signal" refers to either an analog or digital value.

The following abbreviations are used in the following description of the preferred embodiment:

| | |
|---|---|
| SAN = | is the signal having both the desired signal component S and undesired noise component N; |
| SANM = | is the measured signal having both signal and noise at the time of measurement; |
| NM = | is the measured signal having only noise at the time of measurement; |
| S = | is the desired (or true) signal; |
| N = | is noise; |
| i = | is the sub-index indicating the frequency sub-band into which the incoming signal is divided; |
| C = | is the minimum signal gain within each frequency sub-band; |
| $P_i$ = | is the value of adjustable gain of the amplifier/attenuator within sub-band i; and |
| D = | is a constant representing the maximum increase rate of the noise level estimate NM during the time between subsequent sampled time intervals. |

Figure 1:
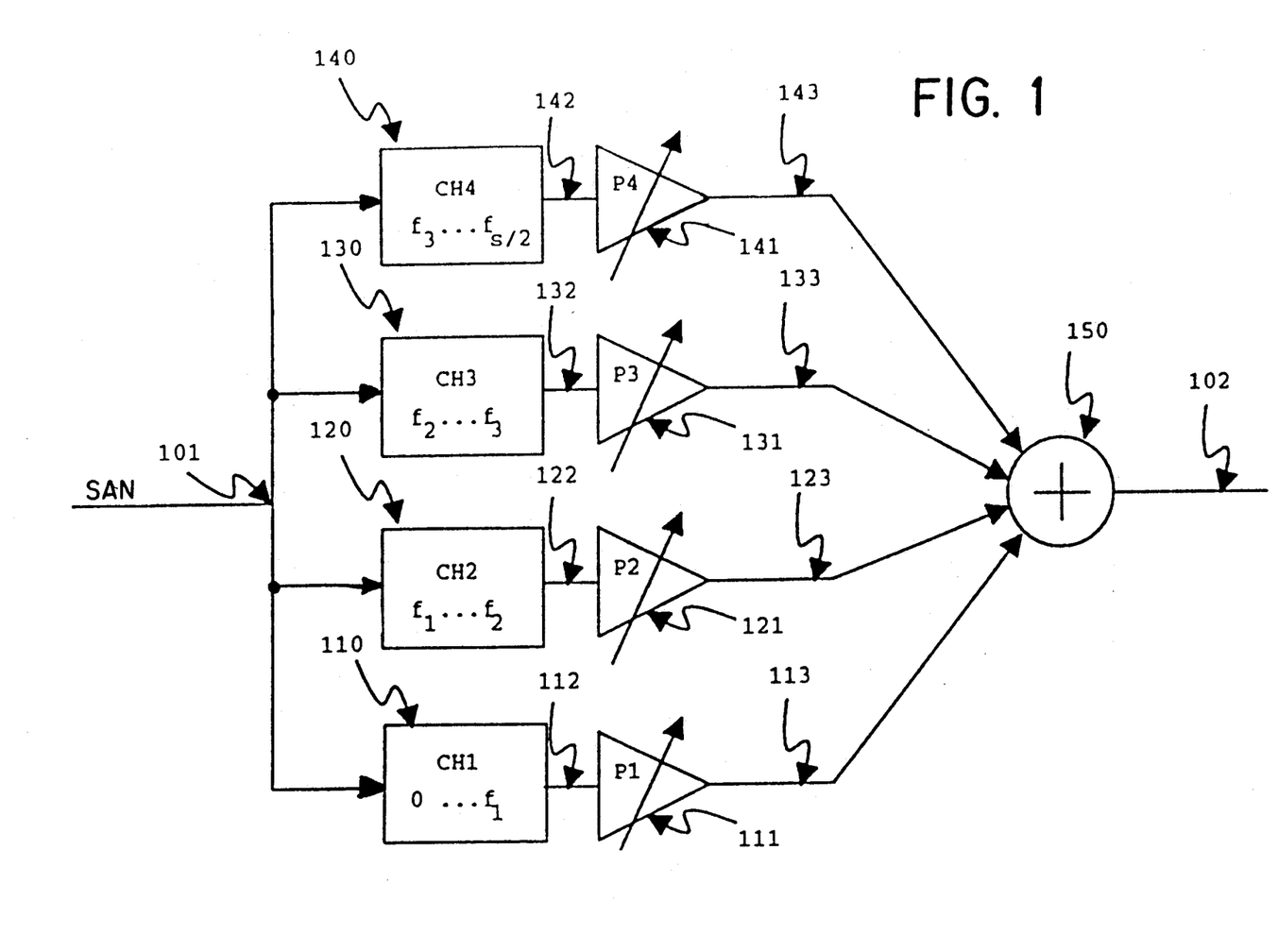
FIG. 1 is a block diagram of an apparatus which performs the method according to the present invention.
Figure 2:
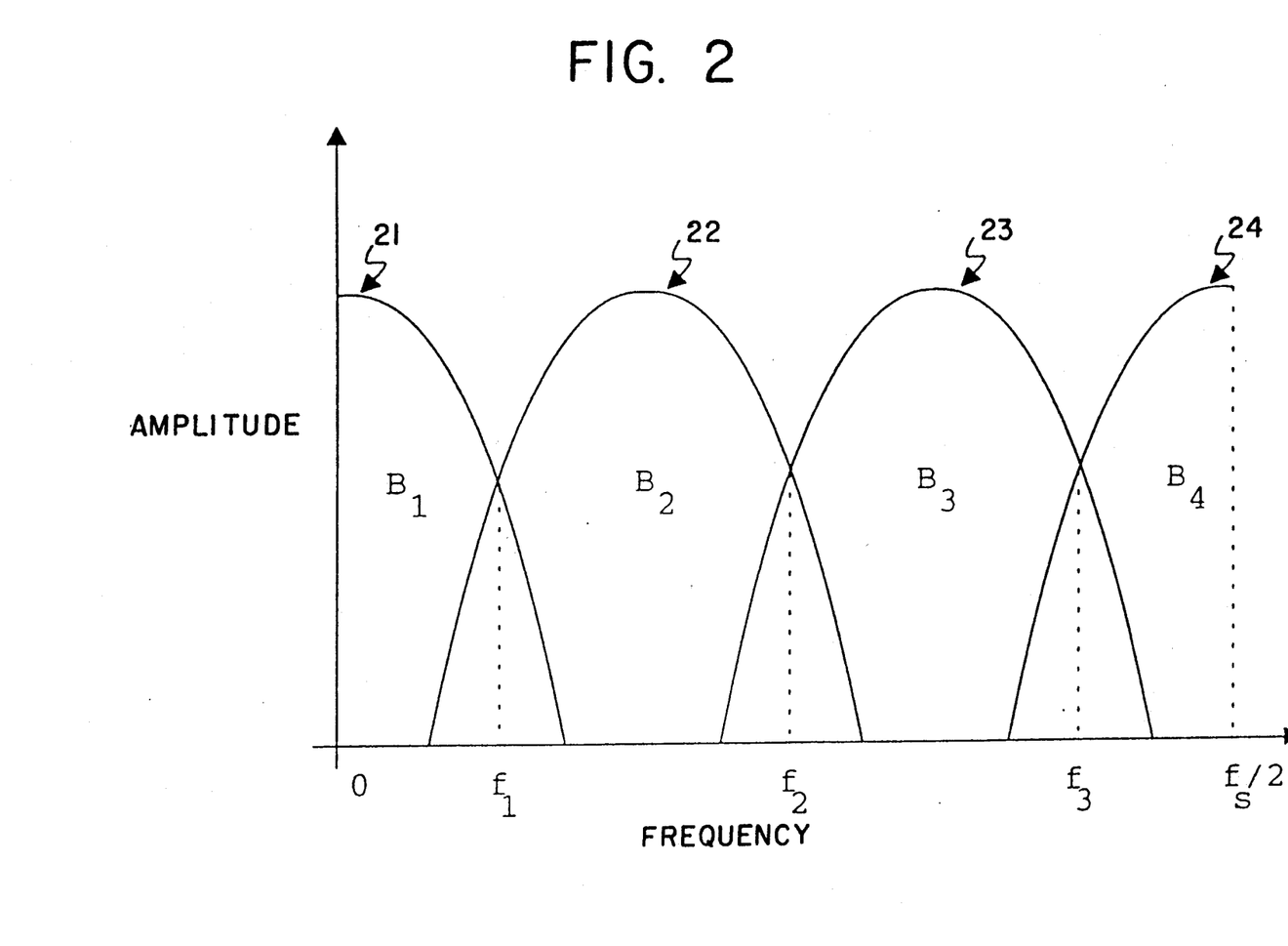
FIG. 2 is a graph representing the division of a communication signal into sub-bands.

FIG. 1 is a block diagram of a circuit performing the method of the present invention. This embodiment divides the communication signal into four sub-bands, but other embodiments may separate the channel into more or less sub-bands. An input signal (SAN) 101, containing both the desired (or true) signal and noise components, is supplied to a plurality of filter blocks 110, 120, 130, and 140 in which the input signal is divided into frequency sub-bands B1-B4 (FIG. 2). The output signals 112, 122, 132, and 142 from the filters are then fed into adjustable gain amplifiers P1-P4. The amplifiers use the method presented in this invention to suppress or eliminate frequency sub-bands according to the amount of noise detected in the sub-band. Finally, the unsuppressed or uneliminated portions of the sub-bands are combined in summing device 150 to generate a noise attenuated output signal 102 having an improved signalto-noise ratio. This signal is then carried further in the radio telephone or other device.

FIG. 2 shows the division of the noisy signal (SAN) into frequency sub-bands B1, B2, B3, and B4 by using an all-pass filter construction. The frequencies $f_1$, $f_2$, and $f_3$ are the limit frequencies of the bands.

The transfer function of the first order all-pass filter is:

$$A_1 = (a + z^{-1})/(1 + az^{-1}). \quad (1)$$

The transfer function of the second order all-pass filter is:

$$A_2 = (b + cz^{-1} + z^{-2})/(1 + cz^{-1} + bz^{-2}). \quad (2)$$

Coefficients a, b, and c are obtained form the formula:

$$a = \sin(\omega/2 - \Pi/4)/\sin(\omega/2 + \Pi/4);$$

$$b = (a^2 + \alpha)/1 + a\alpha^2);$$

$$c = (2a(1\alpha))/(1 + a\alpha^2);$$

where
$\omega = 2\Pi f/f_s$;
$\alpha = f_s/4f_H$;
$f_H$ = limit frequency of filter; and
$f_s$ = sampling frequency of filter.

The construction of this filter is well known to those skilled in the filter design art.

Figure 3:
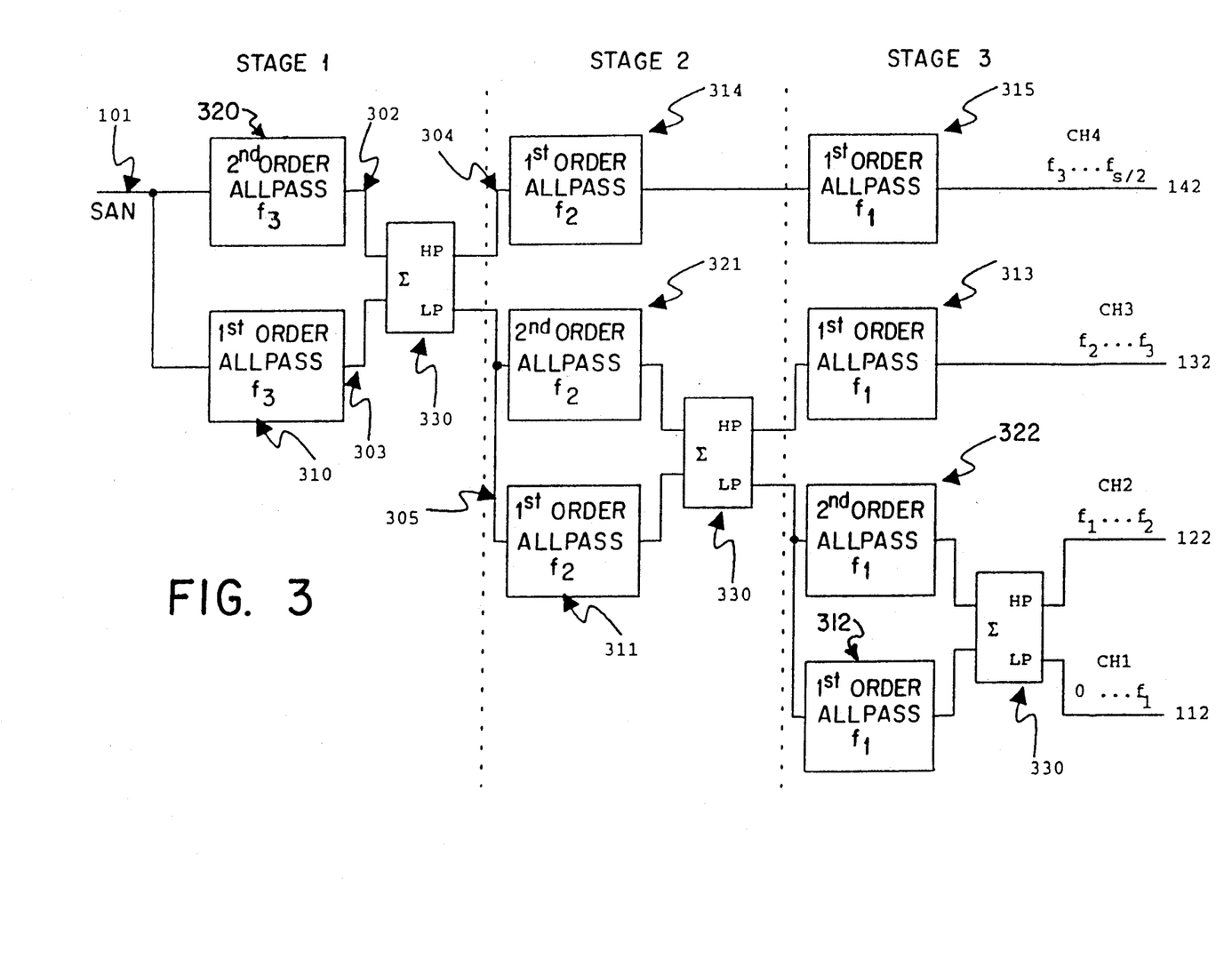
FIG. 3 is a block diagram of a four sub-band filter bank.

The filter bank in FIG. 3 splits the input signal 101 SAN into sub-band signals 112, 122, 132, and 142 using first order all-pass blocks 310–315; second order all-pass blocks 320–322 each with a different frequency parameters (e.g., $f_3$, $f_2$, $f_1$, for filters 320, 321, and 322, respectively); and signal summing blocks 330. The voltage summing blocks (330) are shown in more detail in FIG. 4.

Figure 4:
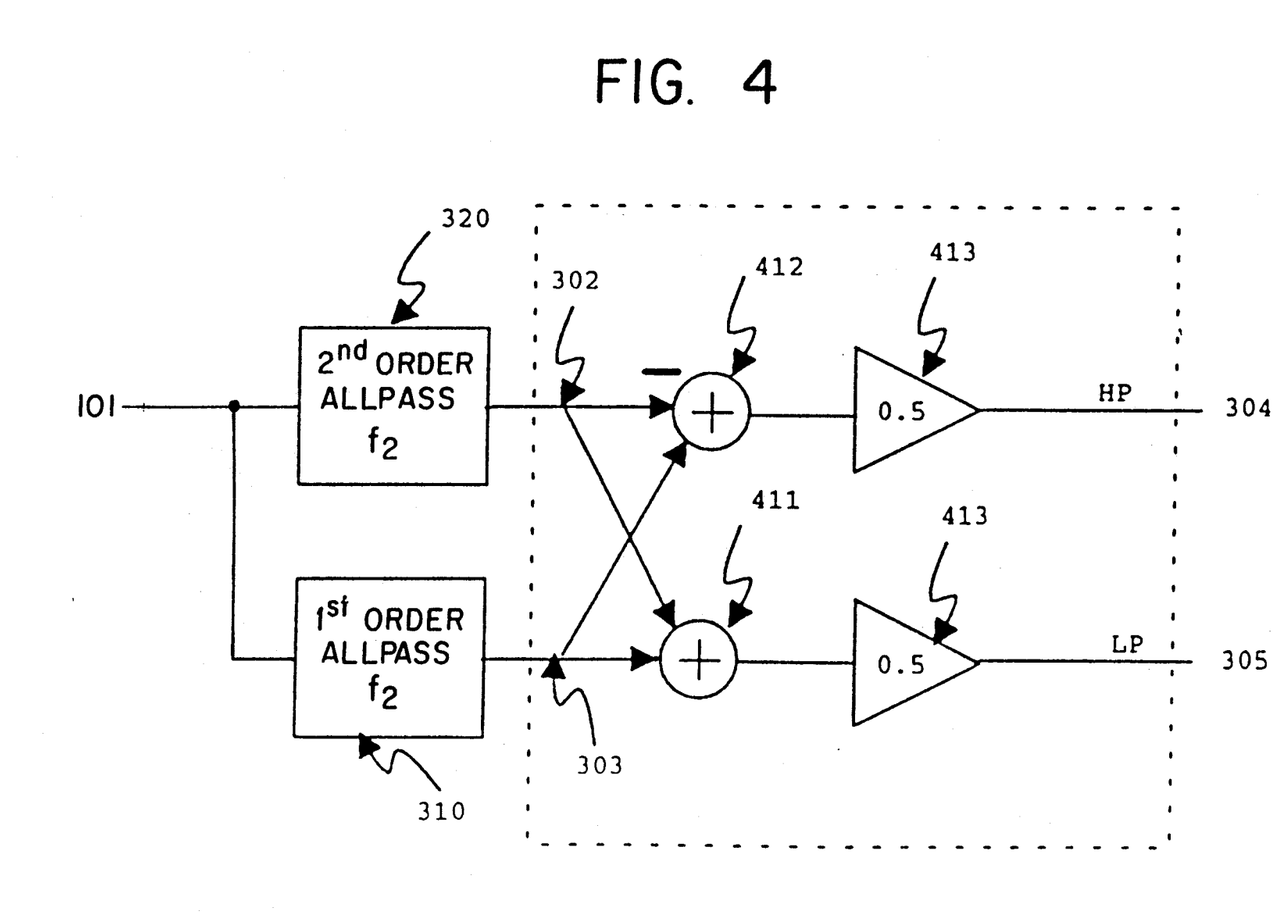
FIG. 4 is a block diagram of a filter block comprising a low-pass filter and a high-pass filter.

FIG. 4 shows one of the summing blocks 330 according to the present invention. The output voltages 302 and 303 from all-pass blocks 310 and 320 are summed and subtracted in blocks 411 and 412, respectively, and multiplied by 0.5 in blocks 413 to form high-pass and low-pass responses 304 and 305. The subtraction can be performed, for example, by inverting signal 302 before sending it to block 411. When the first order equation (1) is subtracted from the second order equation (2), the constant and first order terms are eliminated, leaving second order terms that define a high-pass filter. When these equations are added, the constant and first order terms remain, allowing for low-pass components. The low-pass filtered signal 305 is further filtered into sub-bands in subsequent stages and the high-pass filtered signal 304 is the uppermost sub-band B4 voltage is delayed in all-pass blocks 313 and 315 so that all of the output voltages 112, 122, 132, and 142 are delayed equally.

The filters of the first and second stages have been formed into blocks giving low-pass and high-pass outputs (FIG. 4) because the signal is always divided into two frequency bands. One band is passed on to be delayed by all-pass filters (e.g., filter 313) and the other is further sub-divided. Thus, three filter stages are required to divide the signal into four frequency bands. More stages would be necessary to divide the signal into more sub-bands.

Figure 5:
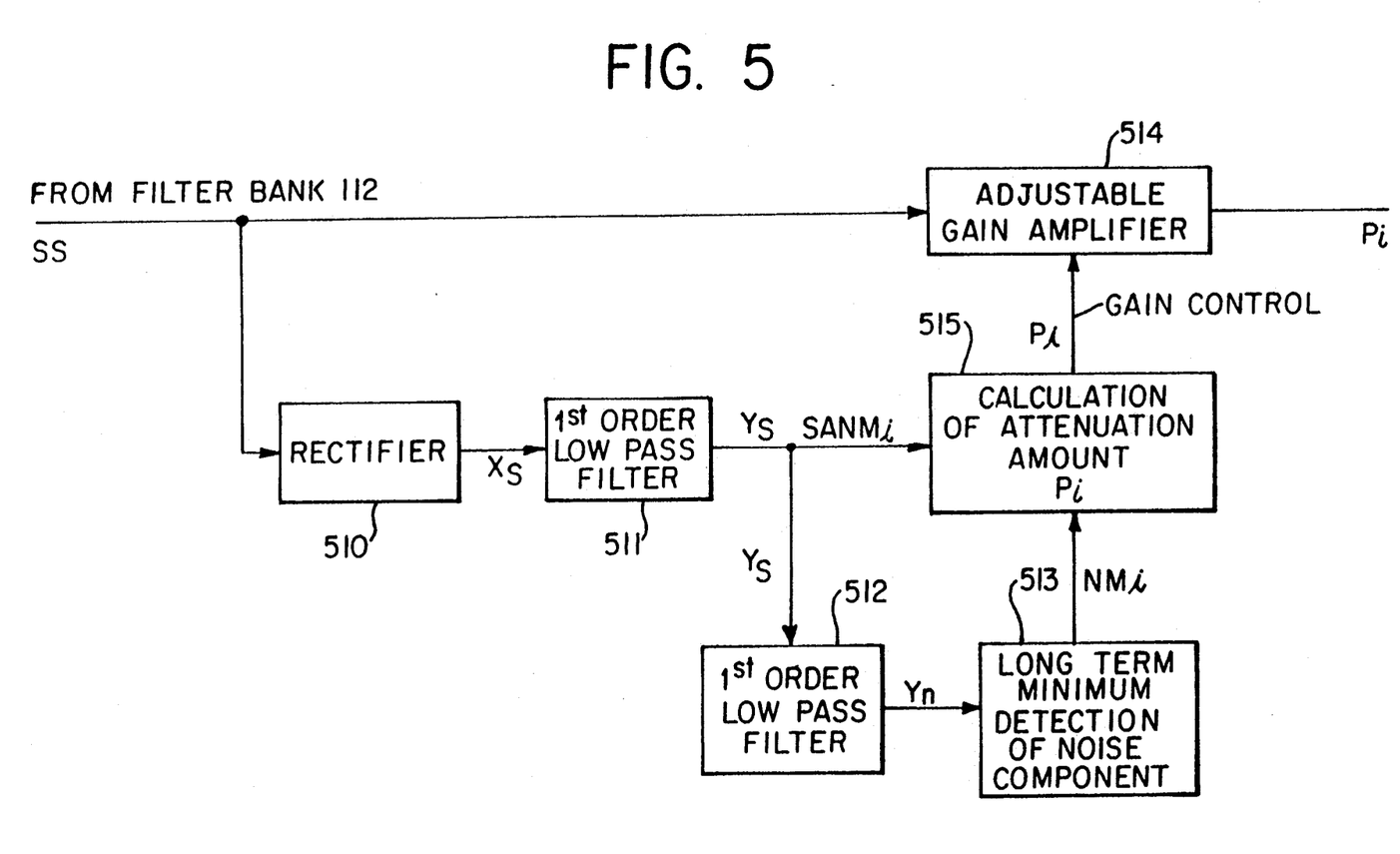
FIG. 5 is a block diagram of an attenuation control means performing part of the method according to the present invention.

FIG. 5 illustrates the attenuation control means. A sub-signal SS (112) which is obtained from a branch of the filter bank, is applied to the input of the attenuation control means which attenuates the signal so that the output voltage is $P_iSS$. The amount of attenuation P is calculated in a calculation block 515. How this result is obtained is described in detail below.

The sub-signal SS 112 (or 122, 132, or 142 as shown in FIG. 1) is obtained from a filter bank branch and includes both a useful (or true) signal component S and a noise component NM. This signal is applied to the input of an adjustable gain amplifier 514 and to the input of the rectifier 510, whose output $x_s$ is then filtered through a first order low-pass filter 511. The low-pass filter 511 can be, for example, a recursive filter of the first order, wherein the filter defines the following equation:

$$Y_s(k) = AX_s(k) + X_s(k-1) - AY_s(k-1)$$

where
$Y_s(k)$ = output value at time point k
A = filter coefficient
$X_s(k-1)$ = input value at time point k − 1
$Y_s(k-1)$ = output value at time point k − 1
$X_s(k)$ = input value at time point k
The construction of the filter is well known to those skilled in the filter art.

Thereafter, the filtered signal $Y_s$ is sent to two branches. The first branch feeds the signal containing the useful signal component and noise component to the first input of the calculation block 515.

The second branch measures the noise level NM from the outputted signal $Y_s$ from the low-pass filter 511. First, the signal $Y_s$ is applied to a first order low-pass filter 512. The recursive filter may again serve as the low-pass filter, wherein the filter defines the following equation:

$$Y_n(k) = Y_s(k) - Y_s(k-1) - BY_n(k-1)$$

where
$Y_n(k)$ = output value at time point k
$Y_s(k)$ = input value at time point k
$Y_s(k-1)$ = input value at time point k − 1
$Y_n(k-1)$ = output value at time point k − 1
B = filter coefficient
The construction of the filter is well known to those skilled in the filter art.

The low-pass filtered signal $Y_n$, which contains signal and noise, is then applied to the long-term minimum detection block 513, which detects a long-term minimum by measuring the signal over time and determines NM by comparing the long-term minimum value with the incoming signal. Since the true signal is sometimes off, the minimum signal over time must be all noise. The value of $NM_i$ at each time point k is determined from the equation:

$$NM_i(k) = \min\{Y_n(k), NM_i(k-1) + D\}$$

where D is a constant representing the maximum increase rate of the noise level $NM_i$ during the time between subsequent time intervals k and k−1. Thus, $NM_i(k)$ is the minimum of either the incoming signal or the previous noise level plus a constant.

Once $NM_i$ is determined, a value for P must be calculated. The output of the long-term minimum detector $(NM_i)$, which represents the noise component, and the output of the first order low-pass filter 511, signal $Y_s$, (hereafter $Y_s$ is referred to as $SANM_i$) are applied to block 515 to calculate the amount of attenuation P. This attenuation amount is calculated according to the following formula:

$$P_i = \max\{(SANM_i - 2\, NM_i)/SANM_i, C\}$$

where

| | |
|---|---|
| $SANM_i =$ | measured value of signal containing both S and N in sub-band i |
| $NM_i =$ | measured value of signal regarded to represent the noise component N in sub-band i |
| $C =$ | constant indicating the minimum gain of the bands, in practice, for example, 0.2. |

Thus, P is based on the amount $SANM_i$ exceeds $NM_i$. The attenuation amount P acts as a gain control for the adjustable gain control amplifier 514 and is substantially in an inverse proportion to $NM_i$.

If there is no desired signal S within the frequency sub-band being examined, $SANM_i$ and $NM_i$ are approximately equal, and the gain $P_i$ in the frequency sub-band is C, C being a constant available in block 515 for the calculation of P. Those skilled in the art will appreciate that a value for C can be part of the hardware of block 515 or can be externally applied to block 515 from a processor or the like. If there is a substantial amount of desired signal S in the sub-signal SS, $SANM_i$ is substantially greater than $NM_i$, and the gain $P_i$ attains a value close to unity and the sub-signal SS in that sub-band is not suppressed at all.

Figure 6:
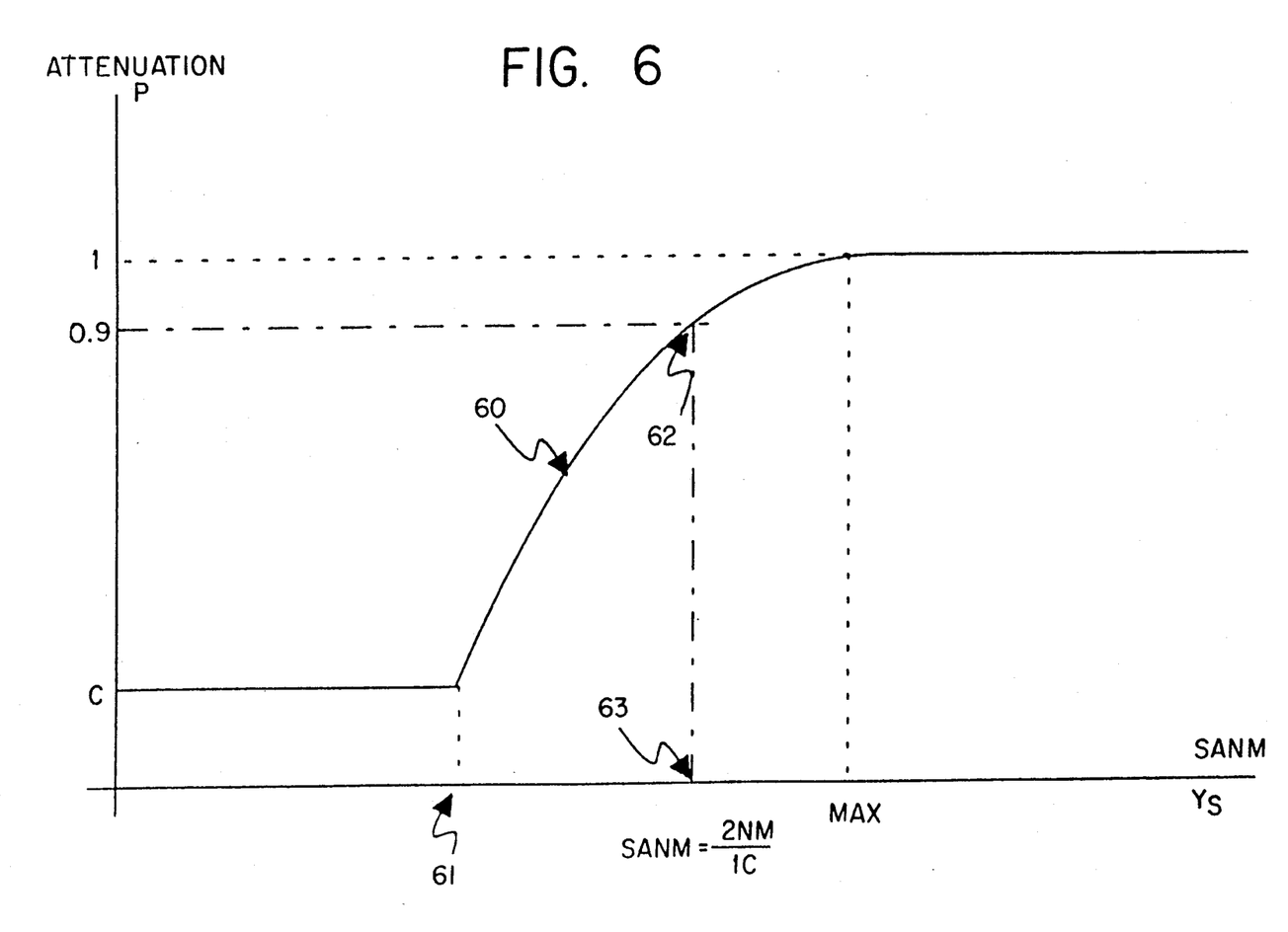
FIG. 6 is a characteristic curve determining the amount of signal transmission in each frequency sub-band as a function of measured value of both desired signal and noise.

FIG. 6 shows the signal gain in an individual sub-band as the function of $SANM_i$. It is seen that when $SANM_i$ is far above $NM_i$, the gain $P_i$ is close to unity. When $SANM_i$ is below $NM_i$, the gain decreases. At the point 61:

$$SANM_i(k) = 2 \times NM_i(k)/(1-C)$$

and $P_i$ is equal to C, the minimum gain.

The value of $P_i$ can be either numerically calculated or realized with other kind of electronic circuitry in block 515 of FIG. 5, e.g., operational amplifiers connected in the fashion of an analog computer.

FIG. 6 provides a practical embodiment. $P_i$ equals 0.9 when the measured noise $NM_i$ (point 63) is 0.36 times the measured $SANM_i$. Thus, a method is obtained where each sub-band signal is passed unchanged when it is continuously time varying and suppressed or rejected when it is constant, e.g., having either no signal at all or only an undesired constant signal indicating that noise is present. The time constants D and C can be selected according to the application. For example, values of D=0.0025 and C=0.2 have been found to improve the quality of a noisy mobile telephone signal.

In the above embodiment, constants C and D are the same values for all frequency sub-bands. However, according to the present invention, they can also be chosen individually for each sub-band to provide an optimum performance. Further, the disclosed embodiment divided the signal into four frequency bands. If more sub-bands are desired, the number of all-pass blocks increases quadratically. Because it would be impractical to use 5 or more sub-bands, 3 or 4 is a good choice for the number of frequency bands.

The method has been favorably tested by practical, subjective experiments.

While the invention has been particularly shown and described with reference to preferred embodiments thereof, it will be understood by those skilled in the art that various changes in form and details may be made therein without departing from the spirit and scope of the invention.

What is claimed is:

1. An improved method to attenuate noise from a noisy input signal in order to generate a noise attenuated output signal, comprising the steps of:
   (a) dividing the noisy input signal into a plurality of channels with respect to signal frequency;
   (b) estimating a noise component in each channel separately by
   i) determining if the divided signal has a constant value over a predetermined period of time, indicating noise, as compared to a continually changing value, indicating the presence of desired signal, said constant value being a reference level, and
   ii) detecting an amount by which the divided signal exceeds the reference level;
   (c) adjusting gain separately for each channel in inverse proportion to the amount of detected excess to create gain adjusted signals; and
   (d) combining said gain adjusted signals from each channel to construct the noise attenuated output signal.

2. A method according to claim 1 wherein the step of adjusting involves increasing the gain from a predetermined minimum value (c) in inverse proportion to the amount of the excess in accordance with a predetermined characteristic curve that has an upper limit (Max), such that signals exceeding the upper limit (Max) have a gain equal to the gain at the upper limit.

3. A method according to claim 1, wherein the step of estimating includes the steps of comparing the signal in each channel to the reference level for that channel, and the gain represented by the amount of signal passed at any given time is equal to $\max\{(S-2N)/S, C\}$ when S is the signal level, N is the reference level and C is a constant indicating a minimum gain in the channel.

4. A method according to claim 1, 2, or 3, wherein the frequency band is divided into channels by using an all-pass filter construction.

5. A method according to claim 4, wherein the input signal is a base frequency speech signal of a communications system and the signal is divided into four channels.

6. An improved method to attenuate noise from a noisy input signal in order to generate a noise attenuated output signal, comprising the steps of:
   (a) dividing the noisy input signal into a plurality of channels with respect to signal frequency using an all-pass filtering method;
   (b) estimating true signal component and noise component from a measurement of the noisy input signal in each channel, said estimating being accomplished by separately measuring and saving as a reference noise level the amplitude of the signal in each channel when it does not vary for a predetermined time, an estimate of said true signal component being formed by measuring an amount by which an instantaneous value of the noisy input signal in a channel exceeds the reference noise level;
   (c) adjusting the gain of the signal component in each channel, said gain adjusting of each channel being separately defined for each channel and being in inverse proportion to the amount by which the signal exceeds the reference level;

(d) combining said gain adjusted signal components to construct the noise attenuated output signal, so that the amplitude of the output signal is, for all frequencies, equal to the noisy input signal, delayed by the time delay of the all-pass channel filters, when the noisy input signal contains noise which is undetected during the step of estimating.

7. The method according to claim 6, characterized in that when said step of estimating detects a true signal amplitude of a channel exceeding the predetermined noise reference level, the gain adjustment on that channel is increased from a predefined minimum value (c) in inverse proportion to the amplitude excess over the predefined reference level in accordance with a given characteristics curve and where said true signal of a channel exceeds a determined upper limit (Max), the gain adjustment is equal to a channel filter response on that channel for each frequency value.

8. The method according to claim 7, wherein the true signal component is formed by rectifying and low-pass filtering the signal in a channel, and said noise component estimate is formed from a previous signal by low-pass filtering and measuring a minimum amplitude value in a predefined time period, in which case said step of gain adjusting on each channel is separately defined by the formula: $\{(S-2N/S), C\}$ where S is the signal amplitude estimate, N is the noise amplitude estimate, C is a constant indicating the minimum gain of a channel, and where the operation max $\{(S-2N/S), C\}$ selects the larger of these two values.

9. The method of claim 8, characterized in that said noise component estimate (N) is defined as the smaller of number $N(k)$ and $N(K-1)+d$ where $N(k)$ is a currently measured value, $N(k-1)$ is a previously measured value, and d is a positive number representing a maximum increase rate of said noise component N.

10. A method according to claim 6, wherein the noisy input signal is a base frequency speech signal of a communication system.

* * * * *